(12) United States Patent
Wu

(10) Patent No.: US 10,657,851 B2
(45) Date of Patent: May 19, 2020

(54) DISPLAY DEVICE

(71) Applicant: InnoLux Corporation, Miao-Li County (TW)

(72) Inventor: Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/436,900

(22) Filed: Jun. 10, 2019

(65) Prior Publication Data
US 2020/0098291 A1    Mar. 26, 2020

Related U.S. Application Data

(63) Continuation of application No. 16/140,462, filed on Sep. 24, 2018, now Pat. No. 10,360,825.

(51) Int. Cl.
*G09F 9/30* (2006.01)
*H01L 51/00* (2006.01)
*H01L 27/12* (2006.01)

(52) U.S. Cl.
CPC .......... *G09F 9/301* (2013.01); *H01L 51/0097* (2013.01); *H01L 27/124* (2013.01)

(58) Field of Classification Search
CPC .... G09F 9/301; H01L 51/0097; H01L 27/124
See application file for complete search history.

(56) References Cited

U.S. PATENT DOCUMENTS

| | | | | |
|---|---|---|---|---|
| 2001/0040645 A1* | 11/2001 | Yamazaki | ......... | G02F 1/133305 349/42 |
| 2006/0029819 A1‡ | 2/2006 | Cho | ......... | H05K 3/388 428/458 |
| 2006/0151792 A1* | 7/2006 | Yamazaki | ......... | G02F 1/13624 257/72 |
| 2007/0181246 A1‡ | 8/2007 | Yamashita | ......... | G02F 1/133305 156/235 |
| 2010/0112789 A1‡ | 5/2010 | Ploessl | ......... | H01L 24/03 438/478 |
| 2012/0199005 A1‡ | 8/2012 | Koji | ......... | A61L 9/205 96/224 |
| 2013/0033888 A1‡ | 2/2013 | Van Der Wel | ......... | F21V 3/06 362/555 |
| 2013/0250546 A1‡ | 9/2013 | Hu | ......... | F21V 9/40 362/84 |
| 2014/0072812 A1‡ | 3/2014 | Hamada | ......... | H01S 5/02296 428/432 |
| 2014/0217373 A1* | 8/2014 | Youn | ......... | H01L 23/4985 257/40 |

(Continued)

*Primary Examiner* — Donald L Raleigh
(74) *Attorney, Agent, or Firm* — Winston Hsu

(57) ABSTRACT

A display device is provided and includes a supporting substrate, a first flexible substrate, an oxide layer, a first insulating layer, a light emitting unit, and a protective layer. The first flexible substrate is disposed on the supporting substrate, and the oxide layer is disposed on the first flexible substrate. The first insulating layer is disposed on the oxide layer, and in a cross-sectional view, the first insulating layer has at least one opening. The light emitting unit is disposed on the first insulating layer, the protective layer is disposed on the light emitting unit, and at least a portion of the protective layer is disposed in the at least one opening.

18 Claims, 12 Drawing Sheets

(56) References Cited

U.S. PATENT DOCUMENTS

| | | | |
|---|---|---|---|
| 2014/0233212 A1‡ | 8/2014 | Park | G02F 1/133606 |
| | | | 362/84 |
| 2015/0123098 A1‡ | 5/2015 | Kang | H01L 51/5253 |
| | | | 257/40 |
| 2016/0028034 A1‡ | 1/2016 | Yasumoto | H01L 51/003 |
| | | | 257/99 |
| 2016/0181338 A1‡ | 6/2016 | Heo | H01L 51/0097 |
| | | | 257/40 |
| 2016/0268488 A1‡ | 9/2016 | Goeoetz | C09K 11/7774 |
| 2017/0160457 A1‡ | 6/2017 | Roh | H01J 11/44 |
| 2018/0090698 A1* | 3/2018 | Jeong | H01L 27/3276 |
| 2018/0122950 A1‡ | 5/2018 | Yamazaki | H01L 21/02178 |
| 2018/0274753 A1‡ | 9/2018 | Sakaino | B32B 7/02 |
| 2018/0340119 A1‡ | 11/2018 | Piquette | F21V 7/22 |
| 2019/0013487 A1‡ | 1/2019 | Park | H01L 51/0097 |
| 2019/0051858 A1‡ | 2/2019 | Tomioka | H01L 51/5246 |
| 2019/0081273 A1‡ | 3/2019 | Sung | H01L 51/5253 |
| 2019/0229282 A1* | 7/2019 | Zhang | H01L 27/3244 |

\* cited by examiner
‡ imported from a related application

DISPLAY DEVICE

CROSS REFERENCE TO RELATED APPLICATIONS

This application is a continuation application of U.S. patent application Ser. No. 16/140,462 filed 2018 Sep. 24, the contents of which are hereby incorporated by reference in their entirety.

BACKGROUND OF THE DISCLOSURE

1. Field of the Disclosure

The present disclosure relates to a display device, and more particularly, to a flexible display device.

2. Description of the Prior Art

In recent years, flexible or deformable electronic device has become one of next generation technologies. The demand of the flexible display device that can be integrated in the electronic device is therefore increased. A flexible electronic device means the device can be curved, folded, stretched, flexed, rolled or the like. In order to achieve flexibility, the substrate of the conventional electronic device is changed from glass to flexible substrate. However, general flexible substrate cannot effectively block moisture or gas (oxygen), so circuit formed on the flexible substrate is easily oxidized and then damaged, especially after bending a number of times. Thus, to mitigate damage to the elements in the flexible electronic device and improve the stability and reliability of the flexible electronic device is still in need.

SUMMARY OF THE DISCLOSURE

According to an embodiment of the present disclosure, a display device is provided. The display device includes a supporting substrate, a first flexible substrate, an oxide layer, a first insulating layer, a light emitting unit, and a protective layer. The first flexible substrate is disposed on the supporting substrate, and the oxide layer is disposed on the first flexible substrate. The first insulating layer is disposed on the oxide layer, and in a cross-sectional view, the first insulating layer has at least one opening. The light emitting unit is disposed on the first insulating layer, the protective layer is disposed on the light emitting unit, and at least a portion of the protective layer is disposed in the at least one opening.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be present (indirectly). In contrast, when an element is referred to as being "directly on" or "directly connected to" another element or layer, there are no intervening elements or layers present.

It should be noted that the technical features in different embodiments described in the following can be replaced, recombined, or mixed with one another to constitute another embodiment without departing from the spirit of the present disclosure.

Figure 1:
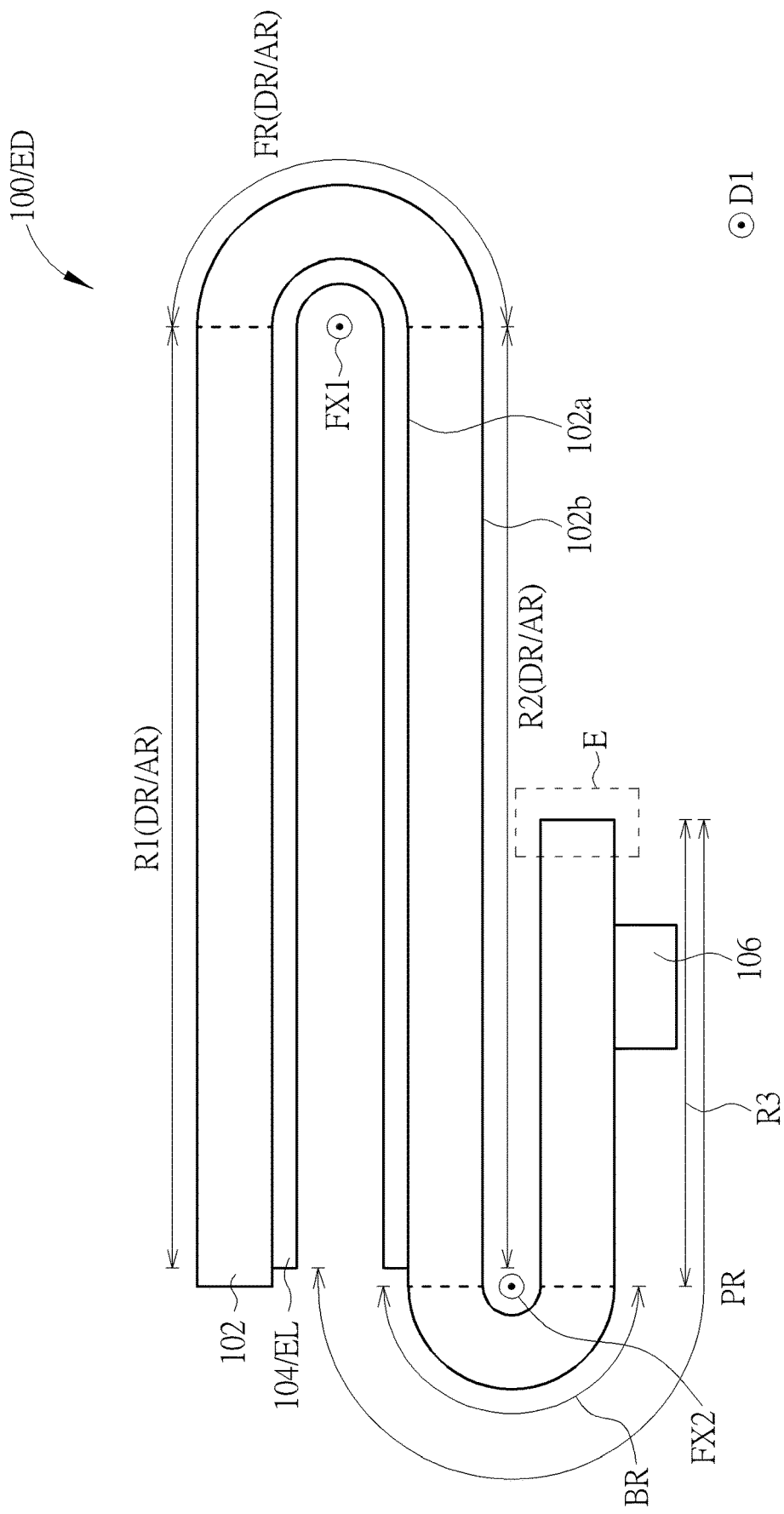
FIG. 1 schematically illustrates a side-view of a flexible electronic device when the flexible electronic device is folded according to a first embodiment of the present disclosure.

FIG. 1 schematically illustrates a side-view of a flexible electronic device when the flexible electronic device is folded according to a first embodiment of the present disclosure. As shown in FIG. 1, the electronic device ED of the first embodiment of the present disclosure is a flexible electronic device. As an example, the flexible electronic device ED may include a flexible display device 100 that could display images. The term "flexible" means that at least apart of the electronic device ED could be deformed, curved, bent, folded, stretched, flexed, and/or rolled. For example, a portion of the electronic device ED may be deformed, curved, bent, folded, stretched, flexed, and/or rolled along a specific direction, but not limited thereto. In this embodiment, the flexible display device 100 may be a foldable display device for explanation of the present disclosure.

The flexible electronic device of the present disclosure can include a flexible base substrate 102, and an electronic structure EL disposed on the flexible base substrate 102. In some embodiments, the flexible electronic device can include an active region AR and a peripheral region PR adjacent to the active region AR. The electronic structure EL can be disposed in the active region AR. Some peripheral circuits and/or control elements can be disposed in the peripheral region PR, and the flexible display device 100 in the peripheral region PR doesn't display image. According to some embodiments, the electronic structure EL can be a display structure 104, so the active region AR is a display region DR for displaying images. Thus, the flexible electronic device is a flexible display device. According to some embodiments, the electronic structure EL can have no display function; for example, can include an antenna, such as a liquid crystal antenna.

For easy explanation, some examples are taken when the electronic structure EL is the display structure 104, and the flexible electronic device ED is foldable in the following descriptions of the present disclosure. Thus, the flexible electronic device ED is the flexible display device 100 that can be folded, as shown in FIG. 1. The flexible display device 100 can be folded along at least one folding axis, such as a first folding axis FX1 parallel to a direction D1 shown in FIG. 1. Thus, the flexible display device 100 can be divided into and defined as a first region R1, a second region R2 and a foldable region FR positioned and connected between the first region R1 and the second region R2. In this embodiment, the first region R1, a second region R2 and a foldable region FR can be included in the active region AR. As described above, when the flexible display device 100 with display function are taken for an example, the active region AR is the display region DR, the first region R1 is a first display region, and the second region R2 is a second display region. In some embodiments, the flexible display device 100 may include elements with display function in the foldable region FR, and thus the foldable region FR is a foldable display region. In other embodiments, the flexible display device 100 may not include elements with display function in the foldable region FR. The flexible electronic device ED in the foldable display region FR may be curved, bended, folded, stretched, flexed, and/or rolled along the first folding axis FX1. The first region R1, the foldable region FR and the second region R2 may be connected in sequence for example, but not limited thereto.

According to the first embodiment, the flexible display device 100 can be a foldable display device, and the flexible base substrate 102 can be a foldable substrate. In other embodiments, the flexible electronic device ED can be a stretchable display device, bendable display device (not shown) or a rollable display device (not shown). For example, the peripheral region PR can be adjacent to the active region AR and can be connected to the second region R2, but not limited thereto. In other embodiments, the peripheral region PR may be connected to an edge of any one of the first region R1, the second region R2 and the foldable region FR.

The flexible display device 100 may further include a control element 106 (such as an integrated circuit (IC)) disposed on a surface (for example, the first surface 102a) of the flexible base substrate 102 in the peripheral region PR. The control element 106 may be electrically connected to the display structure 104 via a plurality of wirings (not shown) to control related display functions. In the peripheral region PR, the flexible electronic device ED can be folded along a second folding axis FX2, such that a bending region BR and a third region R3 is formed, and the bending region BR can be connected between the second region R2 and the third region R3. By means of such folding, a portion of the flexible base substrate 102 having the control element 106 may be bent along the second folding axis FX2 backwardly to a rear surface (the second surface 102b) of the flexible base substrate 102. Accordingly, the control element 106 will not occupy the front side of the flexible display device 100. The area of the flexible display device 100 may be reduced.

Figure 2:
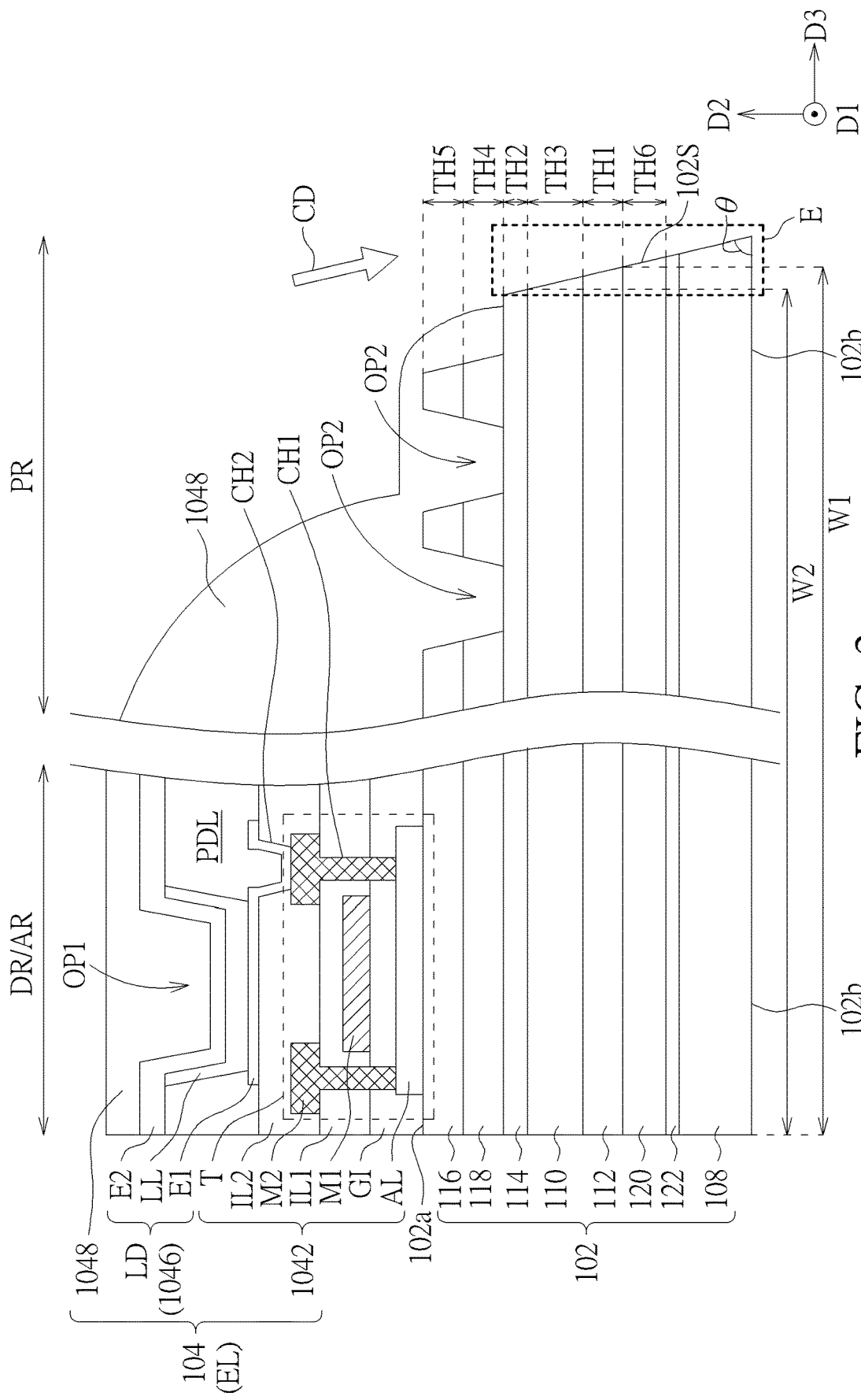
FIG. 2 schematically illustrates cross-sectional views of the flexible display device in some regions of FIG. 1.

Refer to FIG. 2 which schematically illustrates cross-sectional views of the flexible display device in some regions of FIG. 1. For example, FIG. 2 shows the active region AR (display region DR) and the peripheral region PR. In this embodiment, the flexible base substrate 102 includes a supporting substrate 108, a first flexible substrate 110, a first oxide layer 112 and a second oxide layer 114, in which the first flexible substrate 110 is disposed on the supporting substrate 108, the first oxide layer 112 is disposed between the first flexible substrate 110 and the supporting substrate 108, and the second oxide layer 114 is disposed on the first flexible substrate 110 opposite to the first oxide layer 112. In some embodiments, the first oxide layer 112 may be directly formed on a surface of the first flexible substrate 110 facing the supporting substrate 108. In some embodiments, the second oxide layer 114 is directly formed on another surface of the first flexible substrate 110 facing the display structure 104. Through the stack of the first oxide layer 112, the first flexible substrate 110 and the second oxide layer 114, moisture or gas (oxygen) that may damage the display structure 104 or affect the electrical characteristic of the display structure 104 can be significantly blocked from penetrating through the flexible base substrate 102. The first flexible substrate 110 may include, for example but not limited to, PI, PET, PC, PES, PBT, PEN, PAR, or other suitable flexible substrate materials.

Refer to Table 1 which lists the result of the reliability test to the flexible display devices of different samples. The structure of the flexible display device tested in the reliability test includes the first flexible substrate 110, a first layer, a second layer, the display structure 104 and the supporting substrate 108, in which the first layer and the second layer are formed on two opposite surfaces of the first flexible substrate 110, the second layer is disposed between the display structure 104 and the first flexible substrate 110, and the first layer is disposed between the first flexible substrate 110 and the supporting substrate 108. In samples 1, 3, 5 and 7, the first layer is the first oxide layer 112 of the present disclosure, and the second layer is the second oxide layer 114 of the present disclosure. In samples 2, 4, 6 and 8, the first layer is formed of different material from the first oxide layer 112 of the present disclosure, and/or the second layer is formed of different material from the second oxide layer 112 of the present disclosure. The reliability test is to continuously fold up and open the flexible display devices along the first folding axis under both the conditions of 40° C./90% R.H. (relative humidity) and 85° C./85% R.H. for a period of time. In this reliability test, both the thickness of the first layer and the thickness of the second layer are for example 0.5 μm, but not limited thereto. According to Table 1, in samples 2, 4 and 6, when the first layer is formed of nitride layer and/or the second layer is formed of nitride layer, it can be observed that nitride layers peels from the first flexible substrate 110 after the reliability test, such that the flexible display device fails (NG) after the reliability test. Also, in sample 8, when the first layer and/or the second layer include oxynitride, and the content of the oxygen is less than the content of the nitrogen, the first layer and/or the second layer also peels from the first flexible substrate 110 after the reliability test, such that the flexible display device also fails after the reliability test. In contrast, the flexible display devices of samples 1, 3, 5 and 7 are passed in the reliability test. According to some embodiments, from the above test, the first layer can be an oxide layer and the second layer can be an oxide layer. According to some embodiments, the first oxide layer 112 and the second oxide layer 114 may for example include silicon oxide (SiOx), silicon oxynitride (SiOxNy), aluminum oxide (AlOx), aluminum oxynitride (AlOxNy) or other suitable oxide materials. When any one of the first oxide layer 112 and the second oxide layer 114 include silicon oxynitride (SiOxNy) or aluminum oxynitride (AlOxNy), the content of the oxygen can be greater than the content of the nitrogen.

TABLE 1

| Sample | 1 | 2 | 3 | 4 |
|---|---|---|---|---|
| Second layer (0.5 μm) | SiOx | SiOx | AlOx | SiNx |
| First flexible substrate | PI | PI | PI | PI |
| First layer (0.5 μm) | SiOx | SiNx | SiOx | SiOx |
| Test result | Pass | NG | Pass | NG |

| Sample | 5 | 6 | 7 | 8 |
|---|---|---|---|---|
| Second layer (0.5 μm) | SiOxNy (x > y) | SiOxNy (x > y) | SiOxNy (x > y) | SiOxNy (x > y) |
| First flexible substrate | PI | PI | PI | PI |
| First layer (0.5 μm) | SiOxNy (x > y) | SiNx | SiOx | SiOxNy (x > y) |
| Test result | Pass | NG | Pass | NG |

In this embodiment, referring to FIG. 2, the flexible base substrate 102 may optionally include a first insulating layer 116 and a second insulating layer 118, in which the first insulating layer 116 is disposed on the second oxide layer 114, the second insulating layer 118 is disposed between the second oxide layer 114 and the first insulating layer 116, and the display structure 104 is directly formed on the first insulating layer 116. For example, the first insulating layer 116 and the second insulating layer 118 may include SiOx, silicon nitride (SiNx), SiOxNy, AlOx, AlOxNy or other suitable insulating materials. In some embodiments, in order to enhance the adhesion between the display structure 104 and the first insulating layer 116, the first insulating layer 116 may be an oxide layer, for example including SiOx, SiOxNy, AlOx, AlOxNy or other suitable oxide materials. In some embodiments, since the Si—N bond has a bonding energy in a range from 397 eV to 399 eV measured by the X-ray photoelectron spectroscopy (XPS), the ability of silicon nitride to block the moisture or gas (oxygen) is better than that of silicon oxide. For enhancing the ability of the flexible base substrate 102 to block the moisture or gas (oxygen), the second insulating layer 118 may include SiNx. In other embodiments, the flexible base substrate 102 may not include the first insulating layer 116 and the second insulating layer 118, and the display structure 104 may be directly formed on the second oxide layer 114.

In some embodiments, referring to FIG. 2, the flexible base substrate 102 may optionally include a second flexible substrate 120 disposed between the first oxide layer 112 and the supporting substrate 108. The second flexible substrate 120 may be formed on the first oxide layer 112 by coating, and the supporting substrate 108 may be adhered to the second flexible substrate 120 by an adhesive layer 122. The second flexible substrate 120 may for example include PI, PET, PC, PES, PBT, PEN, PAR, or other suitable flexible substrate materials. It is noted that since the adhesion between the second flexible substrate 120 and the adhesive layer 122 is greater than the adhesion between the first oxide layer 112 and the adhesive layer 122, the adhesion of the supporting substrate 108 to the first oxide layer 112 can be increased through the second flexible substrate 120.

Refer to Table 2 which lists the result of the reliability test to the flexible display device when the first insulating layer 116, the second insulating layer 118, the second oxide layer 114, the first flexible substrate 110, the first oxide layer 112 and the second flexible substrate 120 are under different thickness conditions. In this reliability test, both the first oxide layer 112 and the second oxide layer 114 include silicon oxide. According to Table 2, when a first thickness TH1 of the first oxide layer 112 is greater than a second thickness TH2 of the second oxide layer 114, the flexible display device 100 passes the reliability test. More specifically, a ratio of the second thickness TH2 to the first thickness TH1 may be greater than or equal to 0.2 and less than 1. Moreover, a third thickness TH3 of the first flexible substrate 110 may be greater than the first thickness TH1 and greater than the second thickness TH2. Specifically, a ratio of a sum of the first thickness TH1 and the second thickness TH2 to the third thickness TH3 of the first flexible substrate 110 is in a range from 0.1 to 0.5. Also, a ratio of the third thickness TH3 to the first thickness TH1 is in a range from 3 to 15. For example, the first thickness TH1 may be in a range from 0.5 μm to 2 μm, and the second thickness TH2 may be in a range from 0.2 μm to 1 μm.

TABLE 2

| | Thickness (pm) | | | | | | | |
|---|---|---|---|---|---|---|---|---|
| First insulating layer (SiOx) (TH5) | 0.29 | 0.30 | 0.29 | 0.27 | 0.27 | 0.27 | 0.31 | 0.29 |
| Second insulating layer (SiNx) (TH4) | 0.06 | 0.06 | 0.06 | 0.06 | 0.06 | 0.07 | 0.07 | 0.08 |
| Second oxide layer (SiOx) (TH2) | 0.54 | 0.52 | 0.54 | 0.49 | 0.52 | 0.56 | 0.84 | 0.53 |
| First flexible substrate (PI) (TH3) | 9.01 | 5.57 | 5.16 | 9.92 | 5.22 | 8.95 | 8.66 | 5.1 |
| First oxide layer | 0.57 | 1.33 | 0.65 | 1.85 | 0.69 | 0.31 | 0.46 | 0.6 |

TABLE 2-continued

| | Thickness (pm) | | | | | | | |
|---|---|---|---|---|---|---|---|---|
| (SiOx) (TH1) Second flexible substrate (PI) (TH6) | 9.35 | 5.75 | 5.54 | 9.86 | 9.68 | 6.48 | 7.96 | 5.48 |
| Test result | Pass | Pass | Pass | Pass | Pass | NG | NG | Pass |

In some embodiments, according to Table 2, when the first insulating layer 116 includes the silicon oxide, the second insulating layer 118 includes silicon nitride, and the first flexible substrate 110 and the second flexible substrate 120 include PI, a rule for designing the thicknesses of the above-mentioned layers may be obtained. That is, a ratio of a sum of the second thickness TH2, a fourth thickness TH4 of the second insulating layer 118 and a fifth thickness TH5 of the first insulating layer 116 to the first thickness TH1 is in a range from 0.5 to 2. In some embodiments, a ratio of the third thickness TH3 of the first flexible substrate 110 to a sixth thickness TH6 of the second flexible substrate 120 is in a range from 0.4 to 1.2. In some embodiments, a ratio of the first thickness TH1 of the first oxide layer 112 to a sum of the third thickness TH3, the first thickness TH1 and the sixth thickness TH6 is in a range from 0.02 to 0.15. A hydrofluoric acid (HF) dip may be used to confirm the interfaces among the above-mentioned layers.

In some embodiments, still referring to FIG. 2, the display structure 104 is disposed on the flexible base substrate 102, and can include a circuit layer 1042, a display layer 1046 and an protective layer 1048. The display structure 104 can be disposed in the display region DR. The display layer 1046 can include organic light emitting diode (OLED), inorganic LED, quantum dot LED (QLED), or a liquid crystal layer. Inorganic LED can be mini-LED or micro-LED. The display layer 1046 can be electrically connected to the circuit layer 1042 and driven by the circuit layer 1042 to display image. In some embodiments, the display layer 1046 can include a plurality of light emitting units LD, for example, a plurality of OLED units, a plurality of quantum dot LED units, or a plurality of inorganic LED units. For simplicity, FIG. 2 only shows one light emitting unit LD, for example, one OLED unit.

The circuit layer 1042 and the light emitting units LD are sequentially formed on the first surface 102a of the flexible base substrate 102, and the protective layer 1048 is formed to cover the circuit layer 1046 and the light emitting units LD for protecting them. For example, the circuit layer 1042 may include transistors T, data lines, scan lines, power lines, and other required elements for driving and controlling the light emitting units LD, and each light emitting unit LD may be electrically connected to the corresponding transistor T. For illustrative clarity and easy explanation, FIG. 2 shows one transistor T and one light emitting units LD as an example, but not limited thereto. As shown in FIG. 2, the transistor T may be a top-gate type thin-film transistor for example. In this situation, an active layer AL including semiconductor material may be first formed on the flexible base substrate 102, a gate insulating layer GI is then formed to cover the active layer AL, and a gate of the transistor T that is formed of a first metal layer M1 is formed on the gate insulating layer GI. Thereafter, an insulating layer IL1 is formed on the gate and the gate insulating layer GI, two contact holes CH1 are formed in the gate insulating layer GI and the insulating layer IL1 to expose two parts of the active layer AL at two sides of the gate, a source and a drain of the transistor T that is formed of a second metal layer M2 are formed on the insulating layer IL1 and fills in the contacts respectively to contact the active layer AL, and then, another insulating layer IL2 may be formed to cover the transistor T, thereby forming the circuit layer 1042. In some embodiments, the first metal layer M1 and the second metal layer M2 may be formed of single layer structure or multilayer structure, such as Ti/Al/Ti layer. It is noted that since the active layer AL is directly formed on the flexible base substrate 102, through the stack of the first oxide layer 112, the first flexible substrate 110 and the second oxide layer 114, or in combination with the first insulating layer 116 and the second insulating layer 118, the active layer AL can be prevented from being affected or oxidized by moisture or gas (oxygen), thereby improving the stability of the transistor T. In some embodiments, the transistor T may be a bottom-gate type thin-film transistor. In such situation, the gate of the transistor T may be directly formed on the flexible base substrate 102, so the design of the above-mentioned flexible base substrate 102 can avoid the gate and/or the active layer being oxidized or damaged by moisture or gas (oxygen).

In some embodiments, referring to FIG. 2, the light emitting unit LD can be an OLED unit. For example, another contact hole CH2 may be formed in the insulating layer IL2 and followed by forming an electrode E1 on the insulating layer IL2. The electrode E1 extends into the contact hole CH2 to be electrically connected to the source/drain of the transistor T. A pixel defining layer PDL is then formed on the insulating layer IL2 and has an opening OP1 exposing the electrode E1. A light-emitting layer LL, such as organic light-emitting layer, is formed on the exposed electrode E1 and followed by forming another electrode E2 on the light-emitting layer LL, thereby forming the light emitting unit (OLED unit). Later, the protective layer 1048 is formed to cover the light emitting unit LD, thereby forming the display structure 104. In some embodiment, when the light emitting unit LD is the inorganic light-emitting diode, the light emitting unit LD may be directly disposed in the opening OP1 of the pixel defining layer PDL, and a filling layer may fill up the opening OP1. In such situation, the light emitting unit LD may be a chip with inorganic light emitting material for emitting light, for example the chip size of a mini-LED is in a range from 100 μm to 300 μm, or the chip size of a micro-LED is in a range from 1 μm to 100 μm.

The method for manufacturing the flexible display device 100 is further detailed in the following description. A roll of the first flexible substrate 110 is provided first, and then, through disposing the first flexible substrate 110 in a chamber and introducing gas for forming silicon oxide into the chamber, the first oxide layer 112 and the second oxide layer 114 may be formed on two opposite surfaces of the first flexible substrate 110 respectively. In this embodiment, through controlling gas flow rate or quantity of the gas, the first thickness TH1 of the formed first oxide layer 112 can be controlled to be greater than the second thickness TH2 of the formed second oxide layer 114. After that, the roll of the first flexible substrate 110 may be cut into a plurality of mother substrates of the first flexible substrate 110, the mother substrate of the first flexible substrate 110 is disposed on a holder in another chamber while a surface of the first flexible substrate 110 with the second oxide layer 114 faces up, and then the second insulating layer 118 and the first insulating layer 116 are sequentially deposited on the second oxide layer 114. Subsequently, a plurality of the display structures 104 are formed on the first insulating layer 116. Subsequently, the formed structure is turned over to allow the first flexible substrate 112 to face up, and then the second flexible substrate 120 is formed on the first oxide layer 112, and the supporting substrate 108 is adhered to the second flexible substrate 120 through the adhesive layer 122. Following that, a cutting process is performed to obtain a plurality of the flexible display devices 100. In some embodiments, the second flexible substrate 120, the first oxide layer 112, the first flexible substrate 110, the second oxide layer 114, the second insulating layer 118, the first insulating layer 116 and the display structure 104 may be sequentially formed on a holding substrate, such as a glass substrate, and then a surface of the second flexible substrate 120 opposite to the first oxide layer 112 is released from the holding substrate and then is adhered to the supporting substrate 108, thereby forming the flexible display device 100.

It is noted that when the first insulating layer 116, the second insulating layer 118, the second oxide layer 114, the first flexible substrate 110, the first oxide layer 112 and the second flexible substrate 120 are cut along a vertical direction D2 perpendicular to the first surface 102a of the flexible base substrate 102, these layers and films may have more stress, such that cracks may be easily produced at the edges of the first insulating layer 116, second insulating layer 118, the second oxide layer 114 and the first oxide layer 112 and extend from the edges toward the center of the flexible base substrate 102. When the flexible display device 100 is bent for a certain number of times, the cracks may extend to the display structure 104 or the moisture or gas may affect the display structure 104 through the cracks, thereby damaging the flexible display device 100. In some embodiments, referring to FIG. 2, the flexible base substrate 102 can be cut along a cutting direction CD not perpendicular to the first surface 102a of the flexible base substrate 102. Thus, stress can be dispersed and/or mitigated, and crack effect can be reduced. Specifically, referring to FIG. 2, the cutting direction CD can be inclined, such that in the edge portion E, the edge surface 102S and the rear surface (the second surface 102b) of the flexible base substrate 102 can form an acute angle θ. In some embodiments, the edge portion E of the flexible base substrate 102 can be disposed in the peripheral region PR as shown in FIG. 2. In some embodiments, although not shown in the figures, the edge portion of the flexible base substrate 102, which has such acute angle included between the edge surface 102S and the rear surface, may be disposed in the region adjacent to or included in the display region DR. By means of the inclined cutting direction CD, in the flexible base substrate 102, a width of the lower layer (toward to the supporting substrate 108) can be greater than a width of the upper layer (away from the supporting substrate 108). For example, a bottom surface of the first oxide layer 112 has a first width W1 along a horizontal direction D3, a bottom surface of the second oxide layer 114 has a second width W2 along the horizontal direction D3, and the first width W1 of the first oxide layer 112 is greater than the second width W2 of the second oxide layer 114.

In some embodiments, the first insulating layer 116 and the second insulating layer 118 may have at least one opening OP2 exposing the second oxide layer 114 in the peripheral region PR of the flexible display device 100, for example, near the edge portion E of the flexible base substrate 102. For example, the number of the opening OP2 may be a plural. Since some cracks are generated at the edge of the first insulating layer 116 and the edge of the second insulating layer 118, through disposing the opening OP2 in the first insulating layer 116 and the second insulating layer 118, the cracks that may be generated in the first insulating layer 116 and the second insulating layer 118 due to many times of bending can be prevented. In some embodiments, the opening OP2 may further extend to the second oxide layer 114. That is, the second oxide layer 114 can include the opening OP2, exposing or not exposing the first flexible substrate 110.

According to some embodiments, the first oxide layer 112 and/or the second oxide layer 114 may be implanted with fluorine ions. Since the fluorine ions can break the twisted bonds, such as Si—O—Si bonds or Si—Si bonds, to form stronger Si—F bonds, the flexibility of the first oxide layer 112 and/or the second oxide layer 114 can be enhanced. In addition, impurities (such as ions) included in the first flexible substrate 110 and/or the second flexible substrate 120 may diffuse toward the display structure 104, thus affecting electrical characteristic. By means of implanting the first oxide layer 112 and/or the second oxide layer 114 with fluorine ions, the impurities can be trapped by the fluorine ions, thereby preventing the impurities from affecting the electrical characteristic of the display structure 104. The first oxide layer 112 and/or the second oxide layer 114 may have a fluorine ion concentration in a range from 1E18 to 5E20 atoms/cm$^3$, which may be measured by Secondary Ion Mass Spectrometer (Sims).

The flexible electronic device (flexible display device) of the present disclosure is not limited to the above embodiment. Further variant embodiments and embodiments of the present disclosure are described below. To compare the embodiments conveniently and simplify the description, the same component would be labeled with the same symbol in the following. The following description will detail the dissimilarities among different embodiments and the identical features will not be redundantly described.

Figure 3:
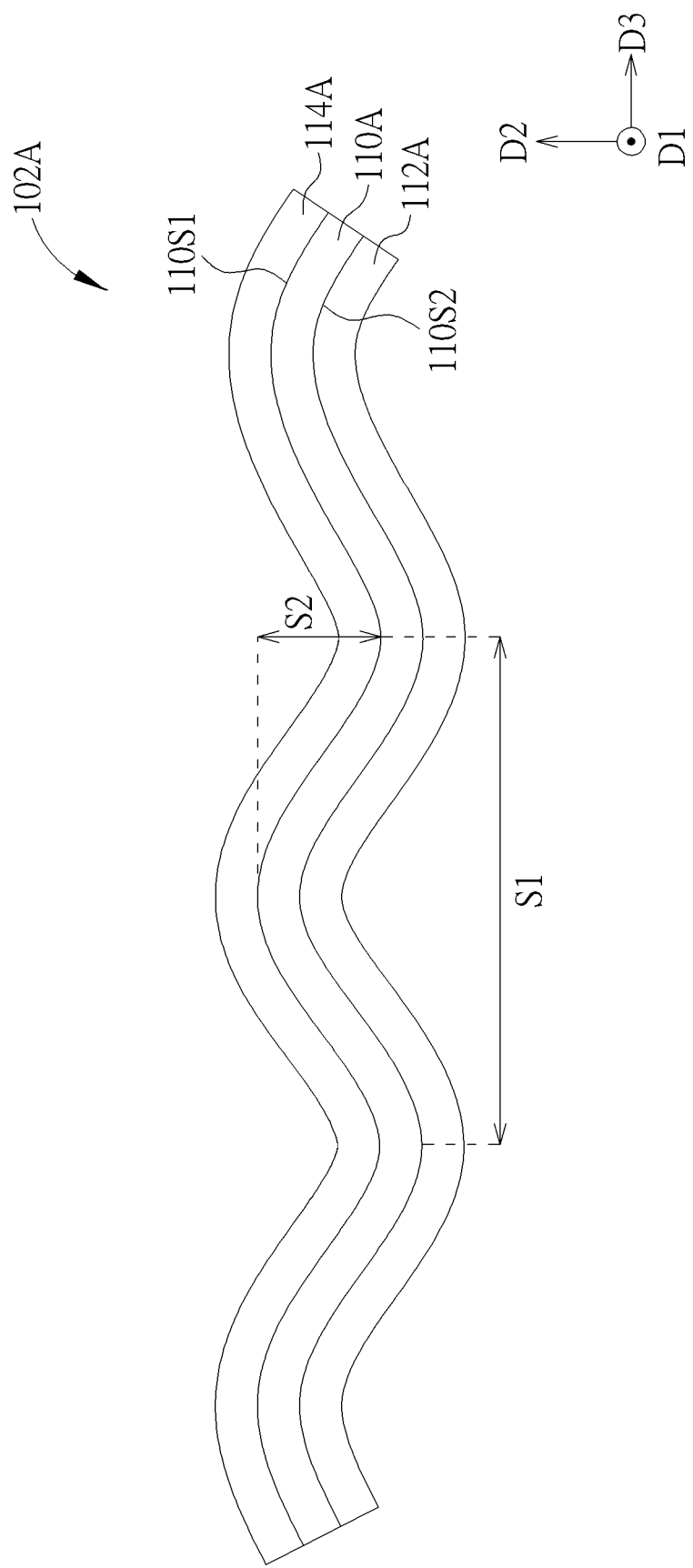
FIG. 3 schematically illustrates a cross-sectional view of a flexible base substrate according to a first variant embodiment of the first embodiment of the present disclosure.

FIG. 3 schematically illustrates a cross-sectional view of a flexible base substrate according to a first variant embodiment of the first embodiment of the present disclosure. For clarity, FIG. 3 omits the first insulating layer, the second insulating layer, the second flexible substrate and the supporting substrate, but not limited thereto. A difference between the flexible base substrate 102A of this variant embodiment and the previous embodiment is that the flexible base substrate 102A has a wavy shape. Specifically, the third thickness TH3 of the first flexible substrate 110A is substantially uniform, and the first flexible substrate 110A has two wavy surfaces 110S1 and 110S2 opposite to each other. For this reason, the display structure, the first insulating layer, the second insulating layer and the second oxide layer 114A formed on one wavy surface 110S1 of the first flexible substrate 110A and the first oxide layer 112A and the second flexible substrate formed on the other wavy surface 110S2 of the first flexible substrate 110A may also have the wavy shape. With this design, the bending damage to the flexible display device may be mitigated. For example, comparing to the flexible display device 100 of the first embodiment, the flexible display device including the flexible base substrate 102A may have better or more stable electrical characteristic after being bent for a number of times, such as 100 times or more. In detail, the first flexible substrate 110A is stretched while forming the first oxide layer 112A and the second oxide layer 114A on the first flexible substrate 110A. After the first oxide layer 112A and the second oxide layer 114A are formed, the first flexible substrate 110A is released from stretching, and then the flexible base substrate 102A with a wavy shape is thus formed. The first flexible substrate 110A, the first oxide layer 112A, and the second oxide layer 114A included in the flexible base substrate 102A can also include such wavy shape. For instance, the wavy first flexible substrate 110A may have a plurality of waves, in which a spacing 51 between two adjacent valleys of the waves may be in a range from 1 μm to 50 μm, and a spacing S2 between a peak and a valley of one of the waves in the vertical direction D2 may be in a range from 1 μm to 50 μm.

Figure 4:
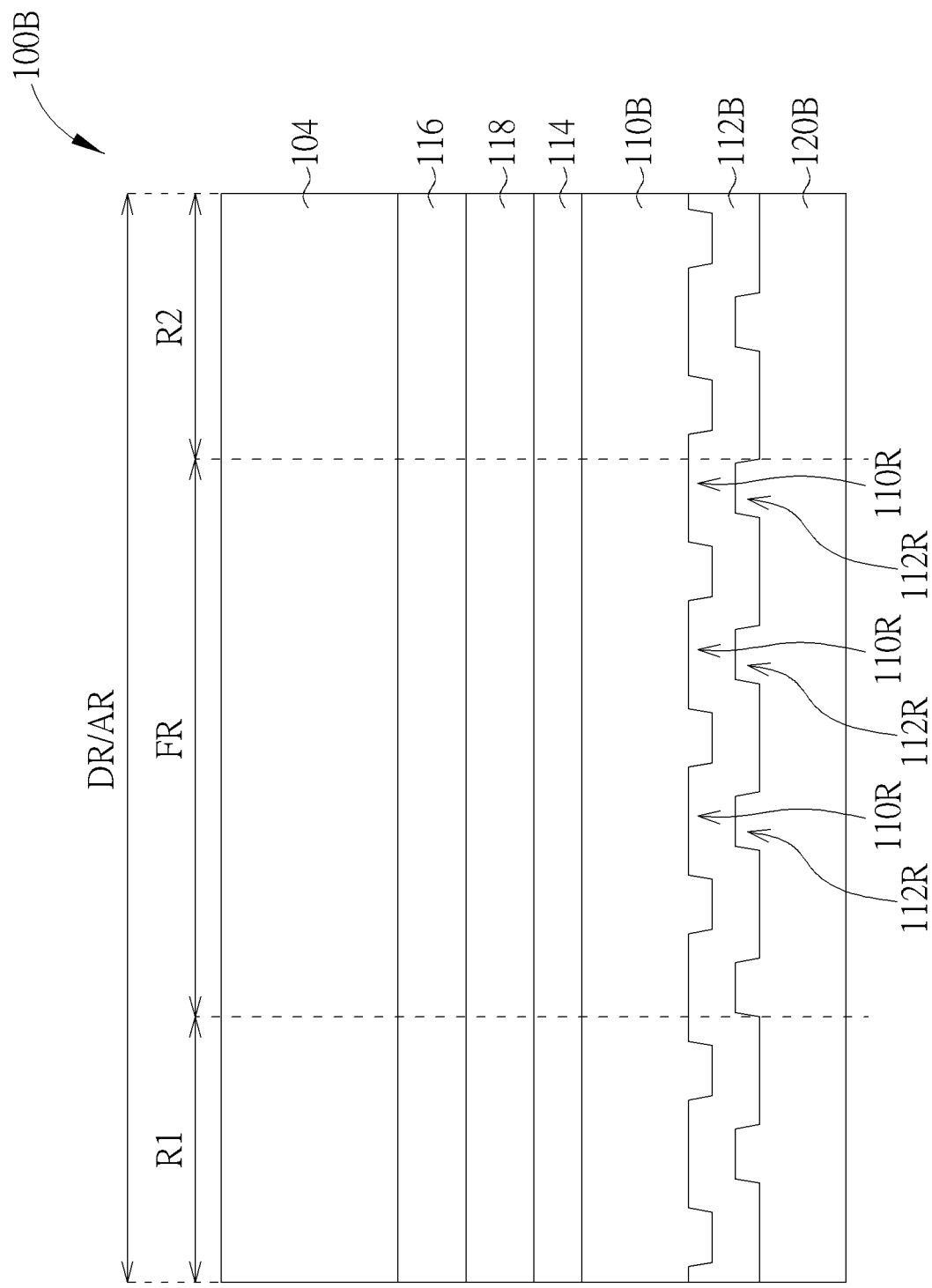
FIG. 4 schematically illustrates a cross-sectional view of a flexible display device according to a second variant embodiment of the first embodiment of the present disclosure.

FIG. 4 schematically illustrates a cross-sectional view of a flexible display device according to a second variant embodiment of the first embodiment of the present disclosure. For clarity, FIG. 4 omits the supporting substrate and the peripheral region of the flexible display device, but not limited thereto. A difference between the flexible display device 100B of this variant embodiment and the previous embodiment is that the first oxide layer 112B of this variant embodiment has an uneven surface, so that the area of the first oxide layer 112B in contact with the first flexible substrate 110B is increased. In this variant embodiment, the first flexible substrate 110B facing the first oxide layer 112B may have a plurality of recesses 110R, for example, in the foldable region FR, and the first oxide layer 112B may fill the recesses 110R, so the interface between the first flexible substrate 110B and the first oxide layer 112B may be uneven and area of which is increased. Accordingly, the moisture and gas may be more effectively blocked. In some embodiments, the recesses 110R can be formed only in the foldable region FR, but not formed in the first and second regions R1 and R2. In this variant embodiment, since the first oxide layer 112B is formed conformally on the first flexible substrate 110B, a surface of the first oxide layer 112B facing the second flexible substrate 120B may also be uneven and have a plurality of recesses 112R. Thus, area of the interface between the first oxide layer 112B and the second flexible substrate 120B may also be increased. In some embodiments, the interface between the first flexible substrate 110B and the first oxide layer 112B may be flat, and a surface of the first oxide layer 112B facing the second flexible substrate 120B may be uneven. In such situation, the first flexible substrate 110 does not include the recesses 110R, but the first oxide layer 112B includes the recesses 112R.

Figure 5:
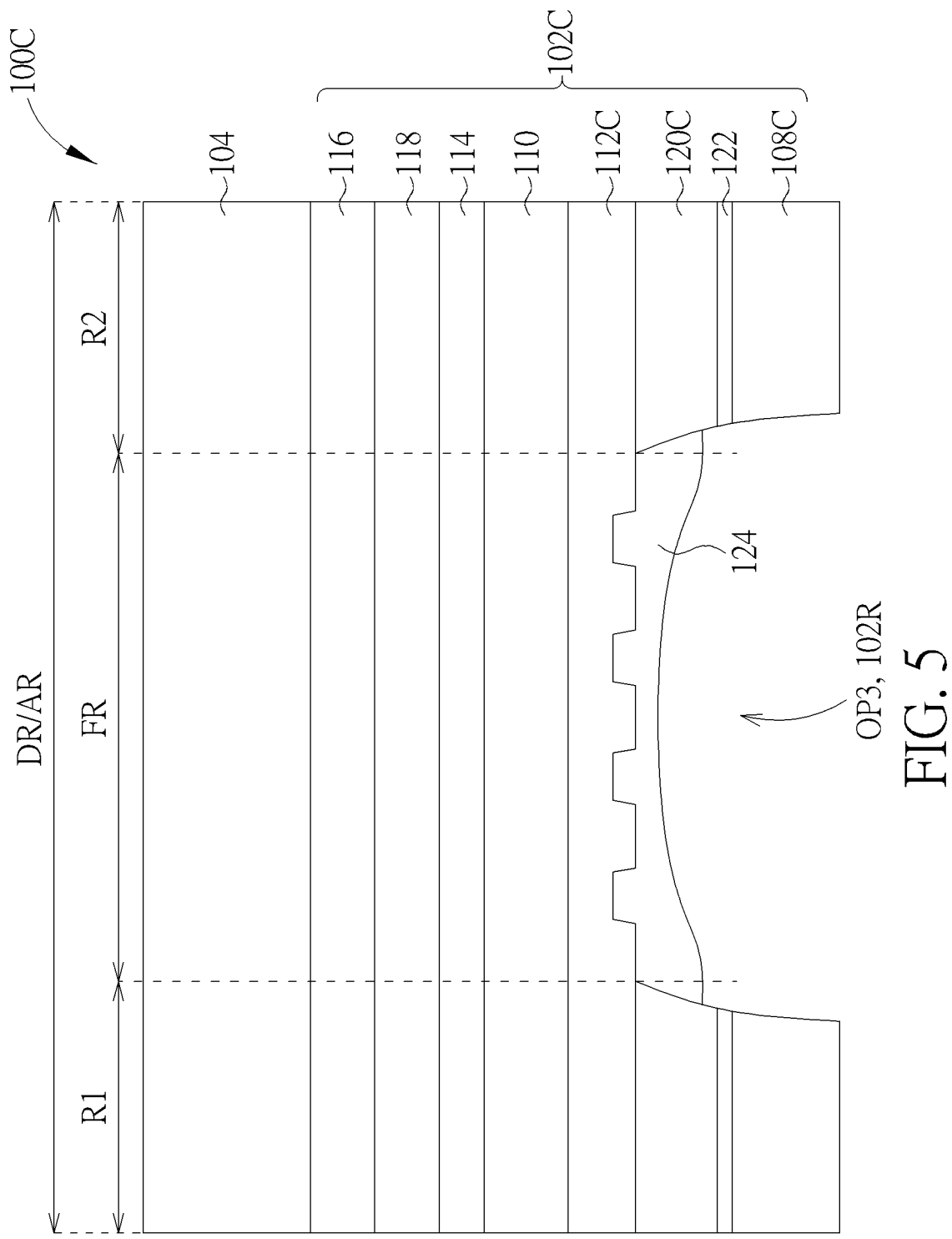
FIG. 5 schematically illustrates a cross-sectional view of a flexible display device according to a third variant embodiment of the first embodiment of the present disclosure.

FIG. 5 schematically illustrates a cross-sectional view of a flexible display device according to a third variant embodiment of the first embodiment of the present disclosure. A difference between the flexible display device 100C of this variant embodiment and the previous embodiment is that the flexible base substrate 102C of this variant embodiment has a recess 102R in the foldable region FR so as to increase flexibility of the flexible display device 100C in the foldable region FR. Specifically, the second flexible substrate 120C and the supporting substrate 108C have an opening OP3 (or the recess 102R) in the foldable region FR, in which the opening OP3 exposes a portion of the first oxide layer 112C. In some embodiments, the flexible base substrate 102C may further include a waterproof layer 124 disposed in the opening OP3, and the waterproof layer 124 covers the exposed portion of the first oxide layer 112C, so that water can be inhibited from entering the flexible display device 100C by the waterproof layer 124. In some embodiments, the exposed portion of the first oxide layer 112C may have uneven surface facing the waterproof layer 124, for example have recesses, so that the contact area between the waterproof layer 124 and the first oxide layer 112C can be increased and adhesion between the waterproof layer 124 and the first oxide layer 112C may be enhanced.

Figure 6:
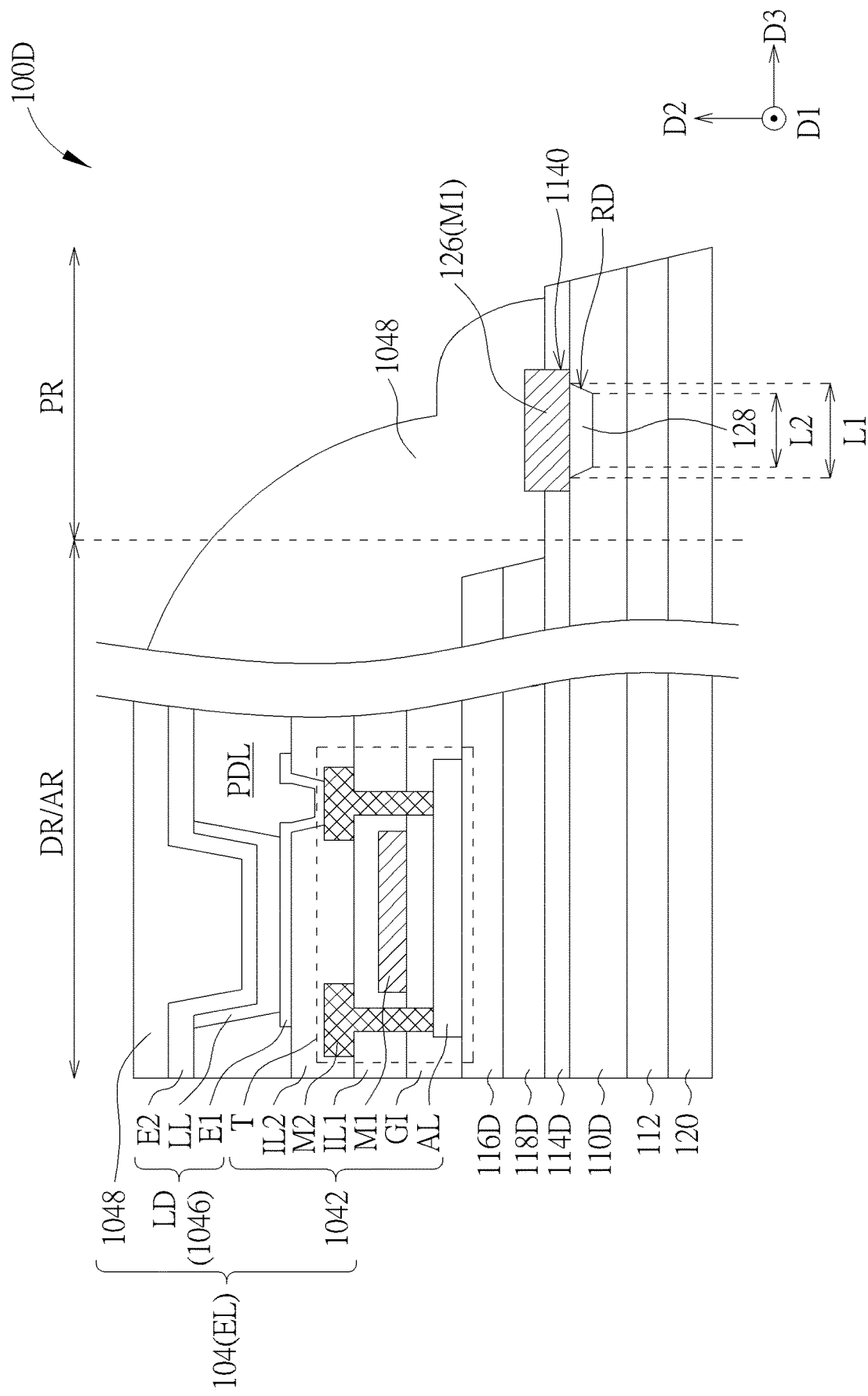
FIG. 6 schematically illustrates a cross-sectional view of a flexible display device according to a fourth variant embodiment of the first embodiment of the present disclosure.

FIG. 6 schematically illustrates a cross-sectional view of a flexible display device according to a fourth variant embodiment of the first embodiment of the present disclosure. For clarity, FIG. omits the supporting substrate, but not limited thereto. A difference between the flexible display device 100D of this variant embodiment and the previous embodiment is that one of the first flexible substrate 110D, the second oxide layer 114D, the second insulating layer 118 and the first insulating layer 116 of this variant embodiment may have at least one recess RD corresponding to a wiring in the peripheral region PR, for example, in the bending region BR (as shown in FIG. 1) of the peripheral region PR. Specifically, the first metal layer M1, the second metal layer M2 or other metal layer may include at least one wiring 126 disposed on the recess RD; for example, the first metal layer M1 include the wiring 126 in the peripheral region PR. In this variant embodiment, the first flexible substrate 110D opposite to the first oxide layer 112 in the peripheral region PR may have the recess RD, the flexible display device 100D may further include a conductive material 128 filling in the recess RD and being disposed between the first flexible substrate 110D and the wiring 126. The wiring 126 may be disposed in an opening 1140 of the second oxide layer 114D so as to contact the conductive material 128. For example, the conductive material 128 may include conductive glue so as to fill up the recess RD, but not limited thereto. Since the conductive material 128 may be more flexible than the wiring 126, if the wiring 126 is broken after bending, the broken portions of the wiring 126 can still be electrically connected to each other through the conductive material 128. In some embodiments, the flexible display device 100D may not include the conductive material, and the wiring 126 may fill the recess RD. In such situation, the wiring 126 may have more contact area with the first flexible substrate 100D, thereby increasing the adhesion between the wiring 126 and the first flexible substrate 100D and mitigating break of the wiring 126. In some embodiments, the recess RD may also be included in any one of the second oxide layer 114D, the second insulating layer 118D and the first insulating layer 116D. In some embodiment, a length L1 of a top of the recess RD along the horizontal direction D3 can be greater than a length L2 of a bottom of the recess RD along the horizontal direction D3. For example, a cross-sectional shape of the recess RD may be inverted trapezoid-shaped, arc-shaped, bullet-shaped, jagged or other suitable shape, which can be formed by photolithography or by laser etching.

Figure 7:
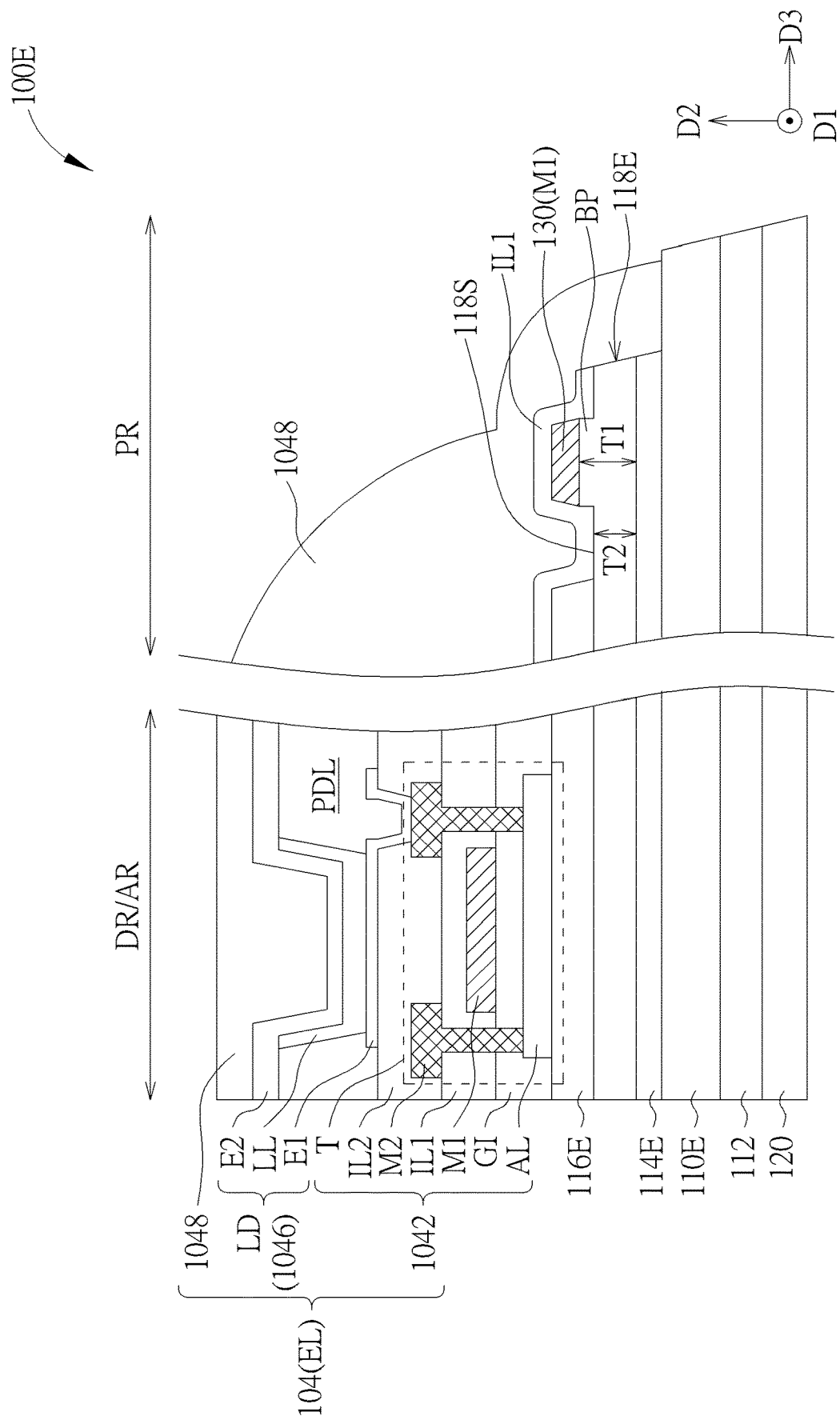
FIG. 7 schematically illustrates a cross-sectional view of a flexible display device according to a fifth variant embodiment of the first embodiment of the present disclosure.

FIG. 7 schematically illustrates a cross-sectional view of a flexible display device according to a fifth variant embodiment of the first embodiment of the present disclosure. For clarity, FIG. omits the supporting substrate, but not limited thereto. A difference between the flexible display device 100E of this variant embodiment and the previous embodiment is that one of the first insulating layer 116E, the second insulating layer 118E, the second oxide layer 114E and the first flexible substrate 110E of this variant embodiment includes at least one bump BP (protrusion) disposed in the peripheral region PR of the flexible display device 100E, for example, in the bending region BR (as shown in FIG. 1) of the peripheral region PR. The first metal layer M1, the second metal layer M2 or other metal layer may include at least one wiring 130 disposed on the corresponding bump BP. In other words, the wiring 130 can be made by the same layer as the first metal layer M1 or the second metal layer M2. For example, the second insulating layer 118E includes at least one bump BP. In other words, the second insulating layer 118E has a thickness T1 corresponding to the bump BP and a thickness T2 outside the bump BP, and the thickness T1 is greater than the thickness T2. The wiring 130 is disposed on and in contact with the bump BP, so that cracks generated at the edge of the second insulating layer 118E doesn't easily extend to the interface between wiring 130 and the bump BP, thereby mitigating peeling of the wiring 130 after bending. For example, a ratio of the thickness T1 to the thickness T2 is in a range from 1.1 to 2. In some embodiments, when the wiring 130 is formed of first metal layer M1, the insulating layer IL1 may cover the wiring 130 in the peripheral region PR. In some embodiments, the bump BP may be included in one of the first insulating layer 116E, the second oxide layer 114E and the first flexible substrate 110E.

Figure 8:
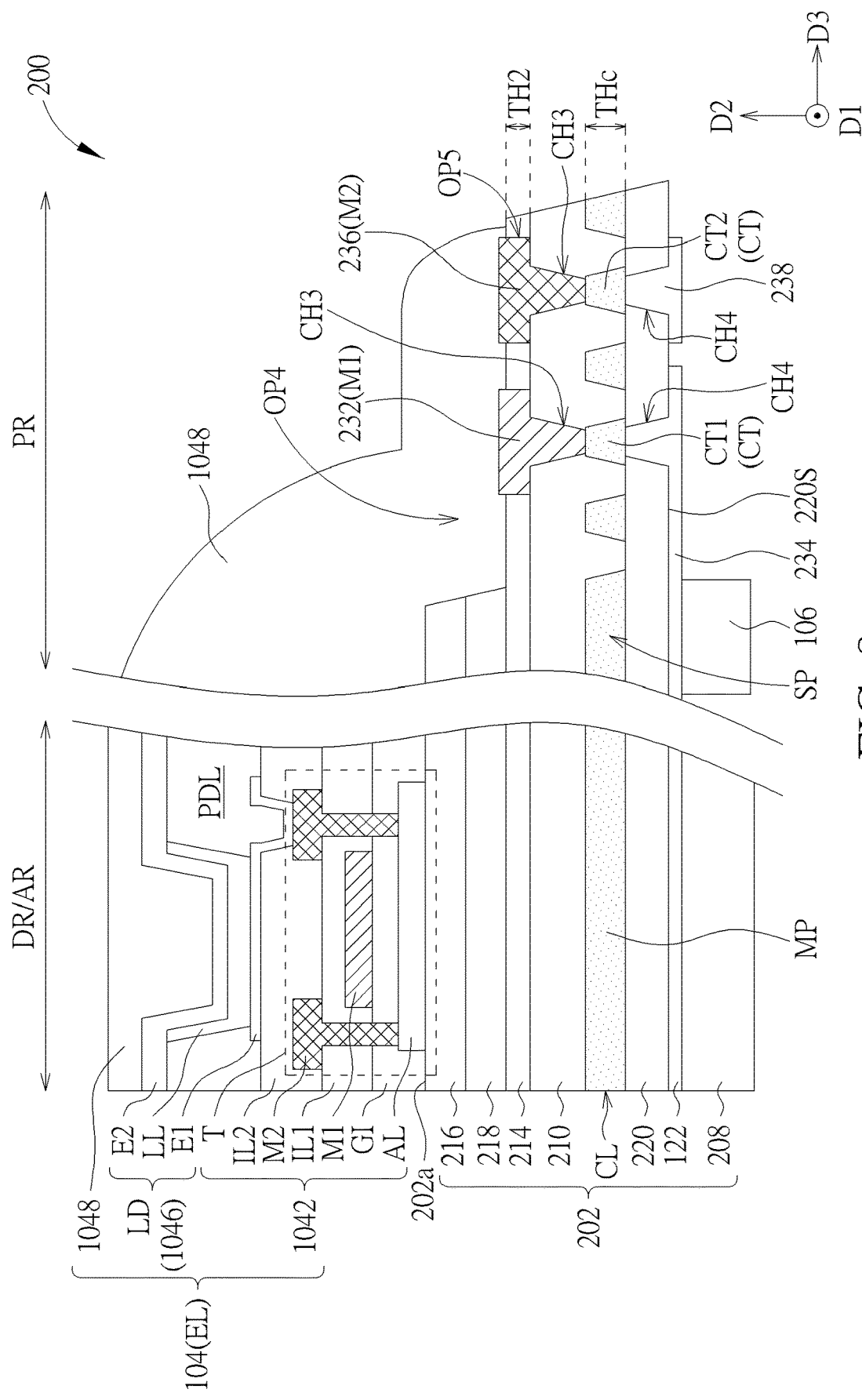
FIG. 8 schematically illustrates a cross-sectional view of a flexible display device according to a second embodiment of the present disclosure.

FIG. 8 schematically illustrates a cross-sectional view of a flexible display device according to a second embodiment of the present disclosure. The flexible display device 200 of this embodiment is different from the first embodiment in that the first oxide layer of the first embodiment may be replaced with a conductive layer CL in this embodiment, and the first thickness THc of the conductive layer CL is also greater than the second thickness TH2 of the second oxide layer 214. In other words, the flexible base substrate 202 includes the conductive layer CL between the first flexible substrate 210 and the second flexible substrate 220. With this design, wirings on the first flexible substrate 210 in the peripheral region PR may be electrically connected to wirings on a bottom surface 220S of the second flexible substrate 220 opposite to the conductive layer CL through the conductive layer CL.

Specifically, the conductive layer CL can include a main portion MP in the active region AR and a signal transmission portion SP in the peripheral region PR. The signal transmission portion SP may include at least one contact CT. The control element 106 may be disposed on the bottom surface 220S of the second flexible substrate 220 facing the supporting substrate 208 and can be electrically connected to the electronic structure EL through the contact CT of the conductive layer CL. In some embodiments, when the flexible display device 200 with display function are taken for an example, the active region AR is the display region DR, and the control element 106 can be electrically connected to the display structure 104 through the contact CT of the conductive layer CL. The main portion MP covers the display structure 104 in the display region DR, for example covers the first region R1, the foldable region FR and the second region R2 shown in FIG. 1, so that the display structure 104 can still be protected from moisture or gas (oxygen). Moreover, the contact CT is disposed in the peripheral region PR and insulated from the main portion MP. The first flexible substrate 210 has at least one contact hole CH3 exposing the top surface of the contact CT, and the first metal layer M1 may include at least one first wiring 232 on the first flexible substrate 210 in the peripheral region PR and filling into the contact hole CH3 to electrically connect the contact CT. The second flexible substrate 220 may has at least one contact hole CH4 exposing the bottom surface of the contact CT. The flexible display device 200 may further include at least one second wiring 234 disposed on a bottom surface 220S of the second flexible substrate 220 and filling into the contact hole CH4 so as to electrically connect the contact CT1 for example. Thus, the first wiring 232, the contact CT1 and the second wiring 234 provide a path for electrically connecting the display structure 104 on the first surface 202a of the flexible base substrate 202 to the control element 106 on the bottom surface 220S of the second flexible substrate 220. Additionally, in order to form the first wiring 232 on the first flexible substrate 210, the first insulating layer 216, the second insulating layer 218 and the second oxide layer 214 may have openings exposing the contact hole CH3. For example, in consideration of blocking the moisture, the opening OP4 of the first insulating layer 216 and the second insulating layer 218 may be greater than the opening OP5 of the second oxide layer 214. With this arrangement, the control element 106 can be disposed on the bottom surface 220S, so that the area of the peripheral region PR can be reduced. In some embodiments, similar to the first metal layer M1, the second metal layer M2 may further include a third wiring 236 filling into another contact hole CH3 and being electrically connected to a fourth wiring 238 on the bottom surface 220S through another contact CT2. In some embodiments, the control element 106 may be spaced apart from the supporting substrate 208. In some embodiments, the first wiring 232 may be formed of the second metal layer M2. In some embodiments, the third wiring 236 may be formed of the first metal layer M1. In some embodiments, the first wiring 232 and the third wiring 236 may be formed of the same metal layer, such as the first metal layer or the second metal layer. In some embodiments, the first wiring 232 and the third wiring 236 may be formed of other metal layers. In some embodiments, the first metal layer M1 can be the layer forming the gate of the transistor T, and the second metal layer M2 can be the layer forming the source and drain of the transistor T.

In this embodiment, the flexible display device 200 may be formed according to the following method. The second flexible substrate 220 is provided first. Then, the conductive layer CL is formed on the second flexible substrate 220 and followed by patterning the conductive layer CL to form the main portion MP in the active region AR and the signal transmission portion SP in the peripheral region. After that, the first flexible substrate 210, the second oxide layer 214, the second insulating layer 218 and the first insulating layer 216 are sequentially stacked on the conductive layer CL, and then, the display structure 104, the contact holes CH3, the first wiring 232 and the third wiring 236 are formed. Subsequently, the contact holes CH4, the second wiring 234 and the fourth wiring 238 may be formed and followed by adhering the supporting substrate 208 to the bottom surface 220S of the second flexible substrate 220 and bonding the control element 106 on the second wiring 234. In some embodiments, before forming the second flexible substrate 220, the second oxide layer 214 and the conductive layer CL may be separately formed on the first flexible substrate 210 and followed by patterning the conductive layer CL. After that, the second flexible substrate 220 can be coated on the conductive layer CL and the first flexible substrate 210. In some embodiments, the flexible display device 200 may not include the second insulating layer 218 and the first insulating layer 216.

Figure 9:
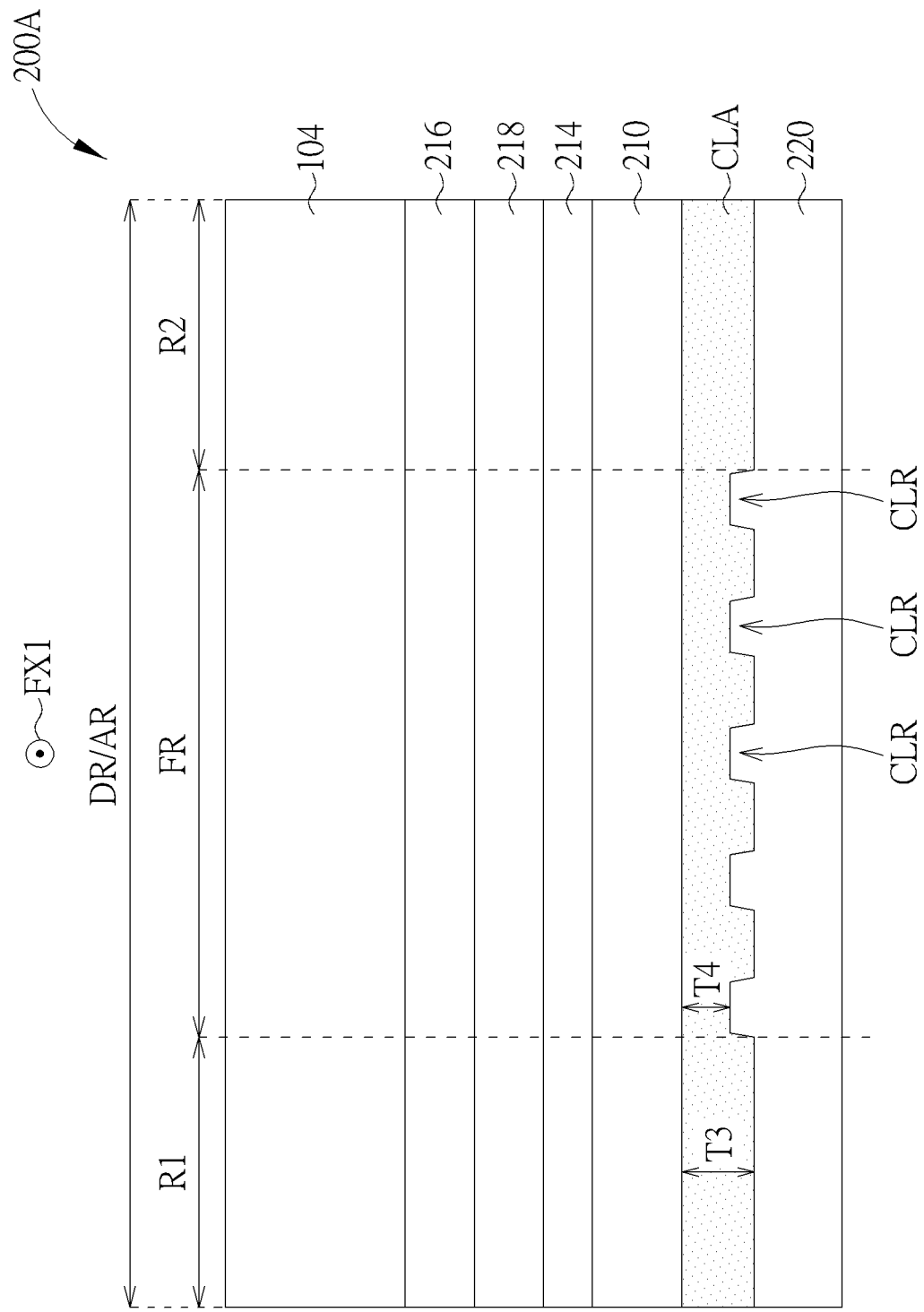
FIG. 9 schematically illustrates a cross-sectional view of a flexible display device according to a first variant embodiment of the second embodiment of the present disclosure.

FIG. 9 schematically illustrates a cross-sectional view of a flexible display device according to a first variant embodiment of the second embodiment of the present disclosure. A difference between the flexible display device 200A of this variant embodiment and the previous embodiment is that the conductive layer CLA of this variant embodiment has an uneven surface in the foldable region FR, so that the flexibility of the flexible display device 200A may be increased. For example, the conductive layer CLA may have a plurality of recesses CLR facing the second flexible substrate 220. A ratio of a thickness T3 of the conductive layer CLA outside the recesses CLR to a thickness T4 of the conductive layer CLA in the region that the recess CLR is disposed is in a range from 1.1 to 2. In some embodiments, the conductive layer CLA may have one recess CLR, and the width of the recess CLR can be the same as the width of foldable display region FR. In some embodiments, the recess CLR of the conductive layer CLA can overlap at least a portion of the first folding axis FX1 (also shown in FIG. 1). In some embodiments, the conductive layer CLA may have at least one opening in the foldable display region FR. In some embodiments, the flexible display device 200 may not include the second insulating layer 218 and the first insulating layer 216.

Figure 10:
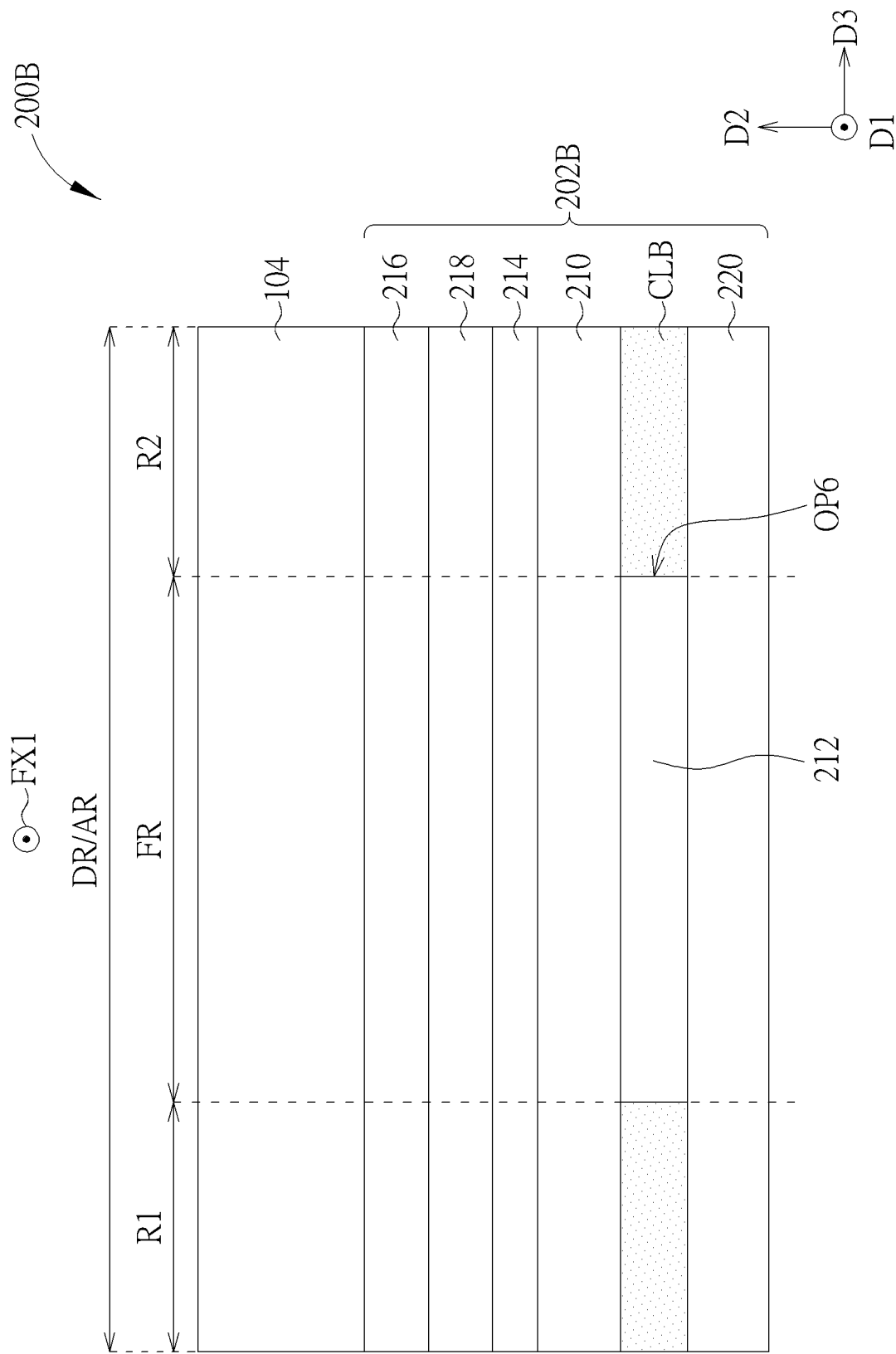
FIG. 10 schematically illustrates a cross-sectional view of a flexible display device according to a second variant embodiment of the second embodiment of the present disclosure.

FIG. 10 schematically illustrates a cross-sectional view of a flexible display device according to a second variant embodiment of the second embodiment of the present disclosure. A difference between the flexible display device 200B of this variant embodiment and the previous embodiment is that the conductive layer CLB may have an opening OP6 in the foldable region FR, and a width of the opening OP6 may be substantially the same as the width of the foldable region FR in the horizontal direction D3. In some embodiments, the opening OP6 of the conductive layer CLB can overlap at least a portion of the first folding axis FX1 (also shown in FIG. 1). In some embodiments, the flexible base substrate 202B may further include a first oxide layer 212 between the first flexible substrate 210 and the second flexible substrate 220 and in the opening OP6, and the first oxide layer 212 covers the openings OP6 and the foldable region FR, so that the moisture and gas may be blocked. In some embodiments, although not shown in figures, the first oxide layer 212 may further extend to be disposed between the conductive layer CLB and the first flexible substrate 210 or between the conductive layer CLB and the second flexible substrate 220. In some embodiments, the flexible display device 200 may not include the second insulating layer 218 and the first insulating layer 216.

Figure 11:
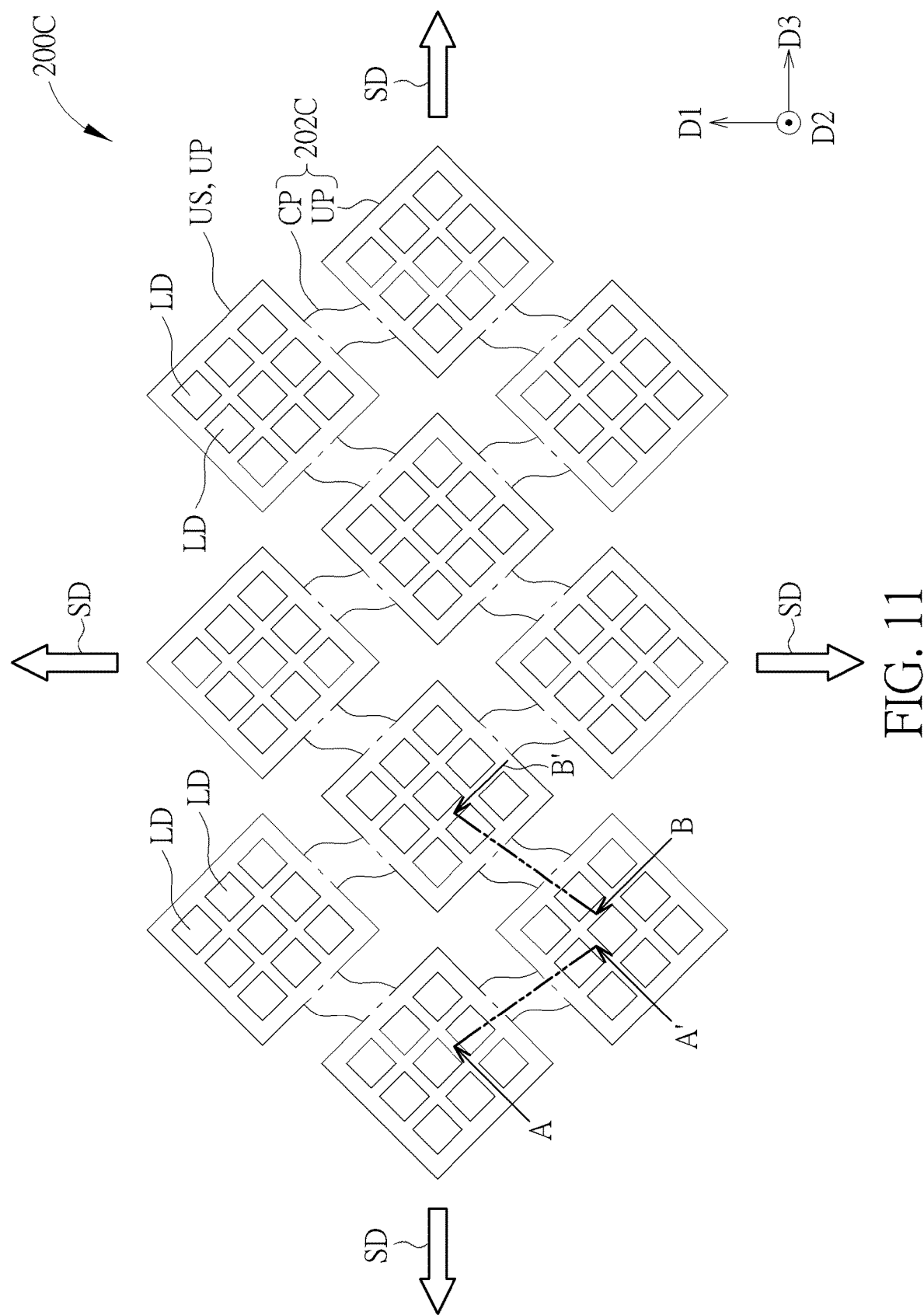
FIG. 11 schematically illustrates a top view of a flexible display device according to a third variant embodiment of the second embodiment of the present disclosure.
Figure 12:
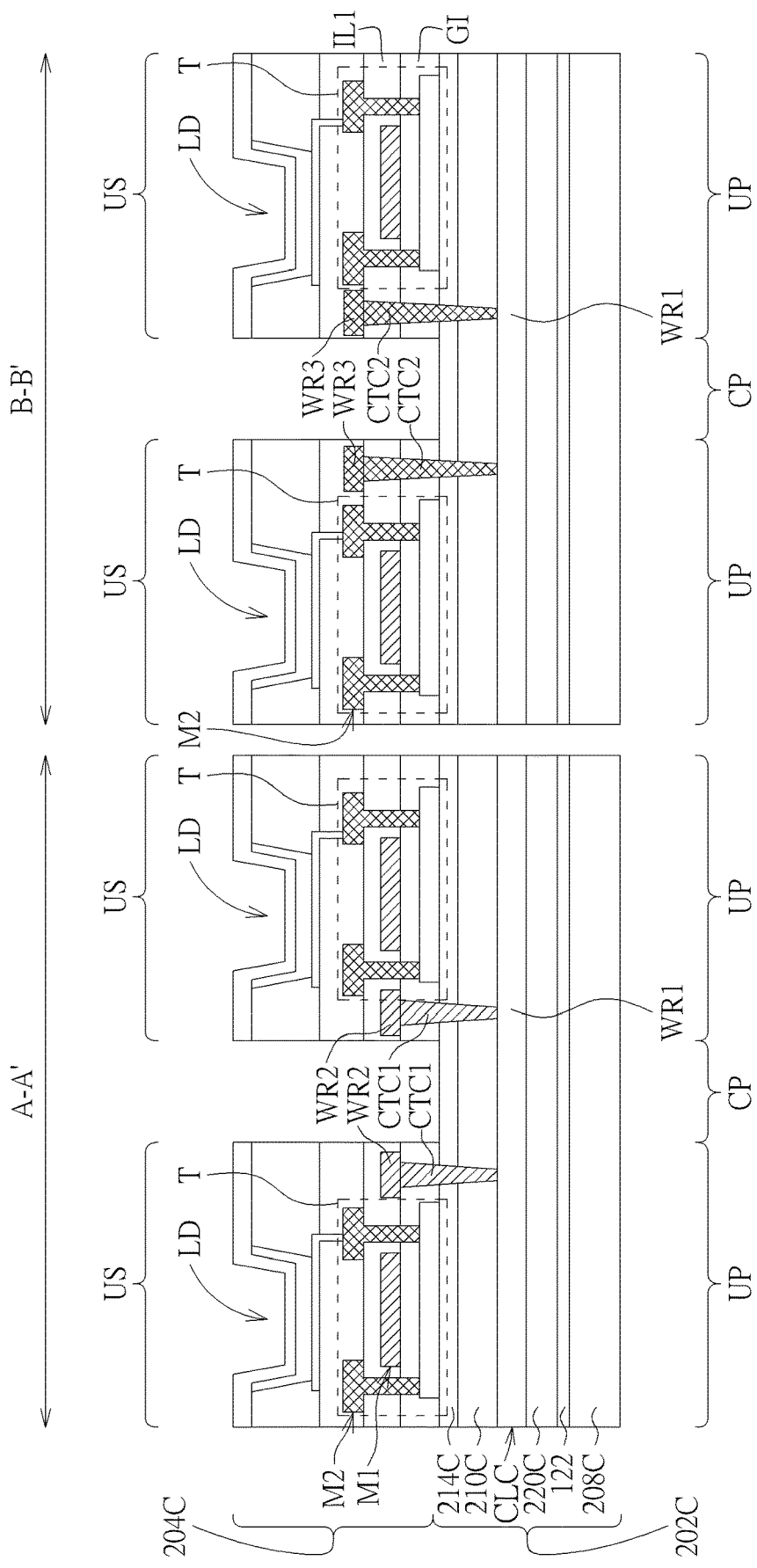
FIG. 12 schematically illustrates cross-sectional views of the flexible display device taken along a line A-A' and a line B-B' of FIG. 11.

FIG. 11 schematically illustrates a top view of a flexible display device according to a third variant embodiment of the second embodiment of the present disclosure, and FIG. 12 schematically illustrates cross-sectional views of the flexible display device taken along a line A-A' and a line B-B' of FIG. 11. As compared with the embodiments mentioned above, the flexible display device 200C of this embodiment is a stretchable display device. In this embodiment, the flexible base substrate 202C may be patterned, such that the flexible base substrate 202C has a mesh shape in a top view. In such situation, the flexible base substrate 202C can be stretched along the stretching directions SD as shown in FIG. 11. Specifically, the mesh-shaped flexible base substrate 202C includes a plurality of unit portions UP and a plurality of connecting portions CP, and any two adjacent unit portions UP are connected by one of the connecting portions CP. Since the width of one of the connecting portions CP is less than the width of one of the unit portions UP, the relative positions between the unit portions UP may be altered when the flexible display device 200C is stretched, which means that the arrangement of the unit portions UP can be changed by stretching. For example, the size of the flexible display device 200C in the horizontal direction D3 may be enlarged through stretching the flexible display device 200C along the stretching direction SD the same as the horizontal direction D3, such that the user can see the enlarged display image. When the flexible display device 200C is not stretched, the size of the flexible display device 200C in the horizontal direction D3 can be shrunk, so the flexible display device 200C can be easily carried. Since the flexible base substrate 202C is mesh-shaped, layers or films in the flexible base substrate 202C may have the mesh shape.

In this embodiment, the flexible base substrate 202C may include the supporting substrate 208C, the first flexible substrate 210C, the conductive layer CLC and the second oxide layer 214C, and all of them have the mesh shape in the top view. In some embodiments, the flexible base substrate 202C may optionally include the mesh-shaped second flexible substrate 220C between the supporting substrate 208C and the conductive layer CLC. In some embodiments, the flexible base substrate 202C may optionally further include the mesh-shaped second insulating layer (not shown) and the mesh-shaped first insulating layer (not shown) sequentially stacked on the second oxide layer 214C. In some embodiments, although not shown in figures, the connecting portions CP may not include the second oxide layer 214C, so as to enhance stretchability of the flexible display device 200C.

Still referring to FIG. 11 and FIG. 12, in this embodiment, the display structure 204C may include a plurality of display unit structures US disposed on the unit portions UP respectively and separated from each other. Each display unit structure US may include at least one light emitting unit LD and at least one transistor T. In some embodiments, each display unit structure US may include a plurality of light emitting units LD and a plurality of transistors T. In some embodiments, the display structure 204C may be replaced with the patterned electronic structure without display function.

Since the display unit structures US are separated from each other, the adjacent unit structures US may be electrically connected to each other by the conductive layer CLC. Specifically, the conductive layer CLC may include a plurality of wirings WR1 insulated from each other. Each unit structure US may include at least one contact, so the adjacent unit structures US may be electrically connected to each other through the wiring WR1 and the contact. For example, referring to FIG. 12, the adjacent unit structures US may include the contacts CTC1 penetrating through the gate insulating layer GI, the second oxide layer 214C and the first flexible substrate 210C to be in contact with one of the wirings WR1, and the first metal layer M1 may include wirings WR2 disposed in two adjacent unit structures US respectively and electrically connected to each other through the contacts CTC1 and one of the wirings WR1. In some embodiments, the wiring WR1 and the contacts CTC1 may be formed of the same first metal layer M1, but not limited thereto. In some embodiments, the contacts CTC1 may not be included in the unit structures US and be included in the connecting portions CP between the unit structures US, and the contacts CTC1 may penetrate through the second oxide layer 214C and the first flexible substrate 210C to contact the wiring WR1. In such situation, although not shown in FIG. 12, the wirings WR2 of the first metal layer M1 may contact the contacts CTC1 in the connecting portions CP respectively. Thus, the wirings WR2 of two adjacent unit structures US can be electrically connected to each other through the contacts CTC1 and the wiring WR1. Similarly, the second metal layer M2 may include wirings WR3 disposed in two adjacent unit structures US respectively, and two adjacent unit structures US may include contacts CTC2, in which the contacts CTC2 penetrate through the gate insulating layer GI, the second oxide layer 214C and the first flexible substrate 210C, the insulating layer IL1. Thus, the wirings WR3 of the second metal layer M2 in different unit structures US may be electrically connected to each other through the contacts CTC2 and one of the wirings WR1. In some embodiments, the wiring WR3 and the contacts CTC2 may be formed of the same first metal layer M2, but not limited thereto.

As mentioned above, according to some embodiments, in the flexible electronic device of the present disclosure, through the stack of the first oxide layer, the first flexible substrate and the second oxide layer, or the stack of the conductive layer, the first flexible substrate and the second oxide layer, moisture or gas (oxygen) that may damage the electronic structure or display structure can be significantly blocked from penetrating through the flexible base substrate. Thus, the electrical characteristic of the electronic structure or the display structure will not be affected, thereby improving the stability and reliability of the flexible electronic device and increasing life of the flexible electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
a supporting substrate;
a first flexible substrate disposed on the supporting substrate;
an oxide layer on the first flexible substrate;
a first insulating layer disposed on the oxide layer, wherein in a cross-sectional view, the first insulating layer has at least one opening;
a light emitting unit disposed on the first insulating layer;
a protective layer disposed on the light emitting unit; and
another oxide layer and a second insulating layer, wherein the another oxide layer is disposed between the supporting substrate and the first flexible substrate, the second insulating layer is disposed between the oxide layer and the first insulating layer, and a ratio of a sum of a thickness of the oxide layer, a thickness of the second insulating layer and a thickness of the first insulating layer to a thickness of the another oxide layer is in a range from 0.5 to 2;
wherein at least a portion of the protective layer is disposed in the at least one opening.

2. The display device according to claim 1, further comprising a circuit layer disposed between the oxide layer and the protective layer, wherein the protective layer covers the circuit layer.

3. The display device according to claim 1, wherein the protective layer contacts the oxide layer.

4. The display device according to claim 1, wherein an edge of the protective layer is curve-shaped.

5. The display device according to claim 1, wherein a thickness of the protective layer between the at least one opening and an edge of the first flexible substrate gradually decreases towards the edge of the first flexible substrate.

6. The display device according to claim 1, wherein the oxide layer is directly on the first flexible substrate, and wherein in the cross-sectional view, a width of a bottom surface of the another oxide layer is greater than a width of a bottom surface of the oxide layer.

7. The display device according to claim 1, further comprising a second flexible substrate and an adhesive layer, wherein the second flexible substrate is disposed between the supporting substrate and the first flexible substrate, and the supporting substrate is adhered to the second flexible substrate by the adhesive layer.

8. The display device according to claim 1, wherein the second insulating layer directly contacts the first insulating layer, and the first insulating layer and the second insulating layer have the at least one opening.

9. The display device according to claim 1, wherein the supporting substrate has an edge surface and a rear surface, and the edge surface and the rear surface form an acute angle.

10. The display device according to claim 1, wherein the oxide layer is implanted with fluorine ions.

11. The display device according to claim 1, wherein in the cross-sectional view, the first flexible substrate has a plurality of waves, and a spacing between two adjacent valleys of the plurality of waves is in a range from 1 μm to 50 μm.

12. The display device according to claim 1, wherein a surface of the first flexible substrate facing the supporting substrate has a plurality of first recesses.

13. The display device according to claim 12, wherein the another oxide layer facing the supporting substrate has a plurality of second recesses.

14. The display device according to claim 1, wherein the supporting substrate has another opening in a foldable region of the display device.

15. The display device according to claim 1, wherein in the cross-sectional view, the first flexible substrate opposite to the supporting substrate has a recess in a peripheral region of the display device, and the display device further comprises a conductive material filling in the recess.

16. The display device according to claim 1, wherein the second insulating layer comprises a bump in a peripheral region of the display device, and the display device further comprises a wiring disposed on the bump.

17. The display device according to claim 1, further comprising a conductive layer between the supporting substrate and the first flexible substrate.

18. The display device according to claim 17, wherein the conductive layer comprises at least one contact, and the at least one contact is electrically connected to a wiring disposed on the first flexible substrate.

* * * * *